(12) United States Patent
Ren

(10) Patent No.: US 8,829,483 B2
(45) Date of Patent: Sep. 9, 2014

(54) SEMICONDUCTOR DEVICE AND MANUFACTURING METHOD THEREOF

(71) Applicant: Semiconductor Manufacturing International (Beijing) Corporation, Beijing (CN)

(72) Inventor: Wanchun Ren, Beijing (CN)

(73) Assignee: Semiconductor Manufacturing International (Beijing) Corporation (CN)

( * ) Notice: Subject to any disclaimer, the term of this patent is extended or adjusted under 35 U.S.C. 154(b) by 0 days.

(21) Appl. No.: 13/895,185

(22) Filed: May 15, 2013

(65) Prior Publication Data

US 2013/0248811 A1 Sep. 26, 2013

Related U.S. Application Data

(62) Division of application No. 13/324,885, filed on Dec. 13, 2011, now Pat. No. 8,466,065.

(30) Foreign Application Priority Data

Sep. 14, 2011 (CN) .......................... 2011 1 0270585

(51) Int. Cl.
| | | |
|---|---|---|
| H01L 47/00 | (2006.01) | |
| H01L 23/48 | (2006.01) | |
| H01L 23/52 | (2006.01) | |
| H01L 29/40 | (2006.01) | |
| H01L 45/00 | (2006.01) | |
| H01L 21/00 | (2006.01) | |
| H01L 21/302 | (2006.01) | |
| H01L 21/461 | (2006.01) | |
| H01L 21/3105 | (2006.01) | |

(52) U.S. Cl.
CPC ............ *H01L 45/1253* (2013.01); *H01L 45/06* (2013.01); *H01L 21/31053* (2013.01); *H01L 45/16* (2013.01); *H01L 45/144* (2013.01); *H01L 45/1233* (2013.01); *H01L 45/1273* (2013.01)
USPC .................. 257/4; 257/758; 438/95; 438/692

(58) Field of Classification Search
USPC ...................... 257/4, 758, E21.582, E21.585, 257/E21.019, E21.648; 438/95, 253, 257, 438/396, 622, 633, 637, 639, 689–692, 696, 438/740, 733
See application file for complete search history.

(56) References Cited

U.S. PATENT DOCUMENTS 6,150,260 A * 11/2000 Roy ............................. 438/629
7,314,776 B2    1/2008 Johnson et al.
(Continued)

*Primary Examiner* — Mary Wilczewski
*Assistant Examiner* — Erik T Peterson
(74) *Attorney, Agent, or Firm* — Innovation Counsel LLP

(57) ABSTRACT

This invention discloses a semiconductor device and its manufacturing method. According to the method, a stop layer is deposited on a step-shaped bottom electrode, and then a first insulating layer is deposited through a high aspect ratio process. A first chemical mechanical polishing is performed until the stop layer. A second chemical mechanical polishing is then performed to remove the upper horizontal portion of the bottom electrode. Then, a phase-change material can be formed on the vertical portion of the bottom electrode to form a phase-change element. Through arranging a stop layer, the chemical mechanical polishing process is divided into two stages. Thus, during the second chemical mechanical polishing process preformed on the bottom electrode, polishing process can be precisely controlled to avoid the unnecessary loss of the bottom electrode.

8 Claims, 11 Drawing Sheets

(56) References Cited

U.S. PATENT DOCUMENTS

| | | |
|---|---|---|
| 7,863,173 B2 | 1/2011 | Kang et al. |
| 2001/0042734 A1 | 11/2001 | Beilin et al. |
| 2008/0220560 A1 | 9/2008 | Klersy |
| 2009/0017577 A1 | 1/2009 | An et al. |
| 2011/0300685 A1* | 12/2011 | Horii et al. ............ 438/382 |
| 2012/0080795 A1* | 4/2012 | Dallmann et al. ......... 257/762 |

* cited by examiner

SEMICONDUCTOR DEVICE AND MANUFACTURING METHOD THEREOF

CROSS-REFERENCE TO RELATED APPLICATIONS

This application is a divisional of U.S. patent application Ser. No. 13/324,885, filed on Dec. 13, 2011, which application claims priority to and the benefit of Chinese Patent Application No. 201110270585.5, filed on Sep. 14, 2011 and entitled "SEMICONDUCTOR DEVICE AND MANUFACTURING METHOD THEREOF", each of which are incorporated herein by reference in their entireties.

BACKGROUND OF THE INVENTION

1. Field of the Invention

The present invention relates to semiconductor techniques, and more particularly to a semiconductor device and its manufacturing method.

2. Description of the Related Art

With the development of semiconductor techniques, phase-change random access memory (PCRAM) is widely recognized as one of the most promising candidates for memory. As a new and developing non-volatile computer memory technique, PCRAM stores data according to the fact that phase-change materials have different electric resistivities in different states. More particularly, phase-change materials have high resistivities in an amorphous state, and, on the contrary, have low resistivities in a crystalline state. Therefore, data can be stored through phase-change materials switching between amorphous and crystalline states, and then data can be read out by measuring the resistances of phase-change materials.

FIG. 1 schematically shows a structural diagram of a memory cell in a phase-change random access memory.

A phase-change material 130 and 140 are sandwiched between an upper electrode 160 in an insulating material layer 150 and a bottom electrode 120 in an insulating material layer 110. Currently, one kind of phase-change materials commonly used is chalcogenide, such as $Ge_2Sb_2Te5$. In a phase-change memory cell having the above structure, joule heat induced by a current flowing between upper electrode 160 and bottom electrode 120 may change the crystal state of a chalcogenide in the phase-change material. Consequently, an amorphous region 140 is generated as the chalcogenide, closer to the bottom electrode 120, changes from crystalline state into the amorphous state.

Below, an existing method of forming phase-change random access memory will be described with reference to FIG. 2A to FIG. 2F.

As shown in FIG. 2A, a first insulating material layer 210 and a second insulating material layer 220 are sequentially formed on a substrate 200, wherein a contact plug 230 is formed in the first insulating material layer 210. A portion of the second insulating material layer 220 is etched off to expose part of the upper surface of the first insulating material layer 210. A bottom electrode material is deposited to form a bottom electrode material layer 240. FIG. 2B is a top view corresponding to FIG. 2A, wherein FIG. 2A is a sectional view taken along a line "A-A" in FIG. 2B.

As shown in FIG. 2C, the bottom electrode material layer 240 is etched to form a step-shaped bottom electrode material layer 250 which is patterned. The bottom electrode material layer 250 has an upper horizontal portion 260, a vertical portion 262, and a lower horizontal portion 264, wherein the lower horizontal portion 264 is in contact with the contact plug 230 in the first insulating material layer 210. FIG. 2D is a top view corresponding to FIG. 2C, wherein FIG. 2C is a sectional view taken along a line "B-B" in FIG. 2D.

As shown in FIG. 2E, an insulating material layer 270 is deposited through a high aspect ratio process (HARP) to cover the bottom electrode material layer 250.

As shown in FIG. 2F, a chemical mechanical process (CMP) is performed, until the upper horizontal portion 260 of the bottom electrode material layer 250 is removed.

Following the above steps, a phase-change material is formed above the vertical portion of the bottom electrode material layer.

According to the above scheme, during the chemical mechanical process in which the upper horizontal portion 260 of the bottom electrode material layer 250 is removed, according to the stacking order of each layer, the insulating material layer 270 and the upper horizontal portion 260 of the bottom electrode material layer 250 are removed in sequence. When the bottom electrode material layer 250 and the insulating material layer 270 are polished at approximately the same rate, polishing time is commonly used as a CMP stop condition. However, the portion of the insulating material layer 270 to be removed is relatively thick and the bottom electrode material layer 250 is relatively thin, furthermore, the insulating material layer 270 maybe uneven in its thickness. As a result, it is difficult to accurately control the polishing time to stop polishing process immediately after removing the upper horizontal portion 260 of the bottom electrode material layer 250. Therefore, after removing the upper horizontal portion 260 of the bottom electrode material layer 250, the vertical portion 262 of the bottom electrode material layer 250 is likely to be over removed, leading to the unnecessary loss of the bottom electrode.

BRIEF SUMMARY OF THE INVENTION

The inventor of the present invention has found the above discussed problem of bottom electrode loss in the prior art. An object of the present invention is to provide a new technical solution for controlling a chemical mechanical process performed on a bottom electrode to avoid the excessive loss of the bottom electrode.

According to one aspect of the present invention, there is provided a method of manufacturing a semiconductor device, comprising: forming a step-shaped bottom electrode on a substrate, the bottom electrode having an upper horizontal portion, a vertical portion and a lower horizontal portion; forming a stop layer above the bottom electrode; forming a first insulating layer above the stop layer; thereafter performing a first chemical mechanical polishing until the stop layer is exposed; and thereafter performing a second chemical mechanical polishing to remove the upper horizontal portion of the bottom electrode.

Preferably, the stop layer comprises at least one of amorphous carbon, $Al_2O_3$, SiCNH, $TiO_2$, $HfO_2$, $Ta_2O_5$ and SiN.

Preferably, the stop layer has a thickness ranging from 200 Å to 1000 Å.

Preferably, the insulating layer is deposited using a high aspect ratio process.

Preferably, the insulating layer comprises silicon oxide.

Preferably, the method further comprises: forming a phase-change material following the second chemical mechanical polishing and above the exposed portion of the bottom electrode.

Preferably, the phase-change material is chalcogenide.

Preferably, the forming of the step-shaped bottom electrode comprises: forming a second insulating layer above the substrate and a third insulating layer above the second insulating layer; removing a portion of the third insulating to expose a part of an upper surface of the second insulating; and thereafter depositing the bottom electrode.

Preferably, the forming of the step-shaped bottom electrode on the substrate further comprises: etching the deposited bottom electrode to pattern the step-shaped bottom electrode.

Preferably, forming a contact plug in the second insulating layer, a lower horizontal portion of the bottom electrode being in contact with the contact plug.

According to another aspect of the present invention, there is provided a semiconductor device, comprising: a substrate; an L-shaped stop layer, the L-shaped stop layer having a vertical portion sandwiched between the vertical portion of the bottom electrode and the first insulation layer, a horizontal portion sandwiched between the lower horizontal portion of the bottom electrode and the first insulation layer, the L-shaped stop layer and the first insulating layer having different chemical mechanical polishing selectivity ratios.

Preferably, the L-shaped stop layer comprises at least one of amorphous carbon, $Al_2O_3$, SiCNH, $TiO_2$, $HfO_2$, $Ta_2O_5$ and SiN.

Preferably, the L-shaped stop layer has a thickness ranging from 200 Å to 1000 Å.

Preferably, the first insulating layer comprises silicon oxide.

Preferably, the semiconductor device further comprises a phase-change material overlying the vertical portion of the bottom electrode.

Preferably, the phase-change material is chalcogenide.

Preferably, the semiconductor device further comprises: a second insulating layer overlaying the substrate; and a third insulating layer overlaying the second insulating layer, the third insulating layer having a sidewall, wherein the lower horizontal portion of the bottom electrode is disposed above the second insulating layer, and the vertical portion of the bottom electrode is adjacent the sidewall of the third insulating layer.

Preferably, the semiconductor device further comprises: a contact plug disposed in the second insulating layer, the lower horizontal portion of the bottom electrode being in contact with the contact plug.

An advantage of the present invention is in that through depositing a stop layer on the bottom electrode, the chemical mechanical polishing process for planarizing the first insulating layer and removing the upper horizontal portion of the bottom electrode can be divided into two stages. The first stage terminates at the stop layer. Polishing time can be easily controlled even if the first insulating layer is relatively thick. It is only needed to remove the upper horizontal portion of the bottom electrode and the stop layer thereon in the second stage. The stop layer has a relatively small thickness, so long as it is sufficient to ensure the stop of the first CMP stage; the bottom electrode is relatively thin. Thus, polishing time can be controlled precisely, so as to prevent the vertical portion of the bottom electrode from being over removed, and reducing the unnecessary loss of the bottom electrode.

Further features of the present invention and advantages thereof will become apparent from the following detailed description of exemplary embodiments according to the present invention with reference to the attached drawings

BRIEF DESCRIPTION OF THE DRAWINGS

The accompanying drawings, which are incorporated in and constitute a part of the specification, illustrate embodiments of the invention and, together with the description, serve to explain the principles of the invention.

The present invention will be more clearly understood from the following detailed description with reference of accompanying drawings, wherein:

FIGS. 2A to 2F schematically show respective steps of manufacturing phase-change random access memory according to the prior art, wherein FIGS. 2A, 2C, 2E-2F are sectional views, and FIGS. 2B and 2D are top views;

FIGS. 3A to 3I schematically show respective steps of a process flow of manufacturing a semiconductor device according to the present invention, wherein FIGS. 3A, 3C, 3E-3I are sectional views, and FIGS. 3B and 3D are top views.

DETAILED DESCRIPTION OF THE INVENTION

Figure 1:
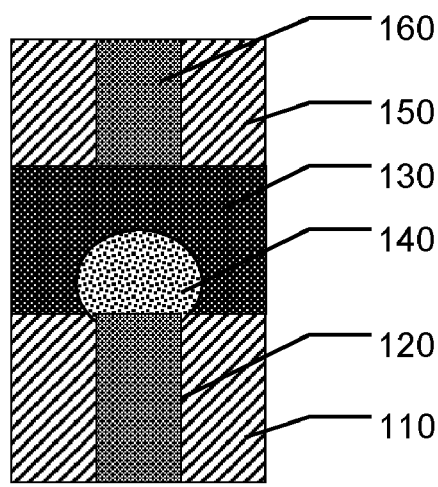
FIG. 1 is a structural diagram of a memory cell in a common phase-change memory.
Figure 2A:
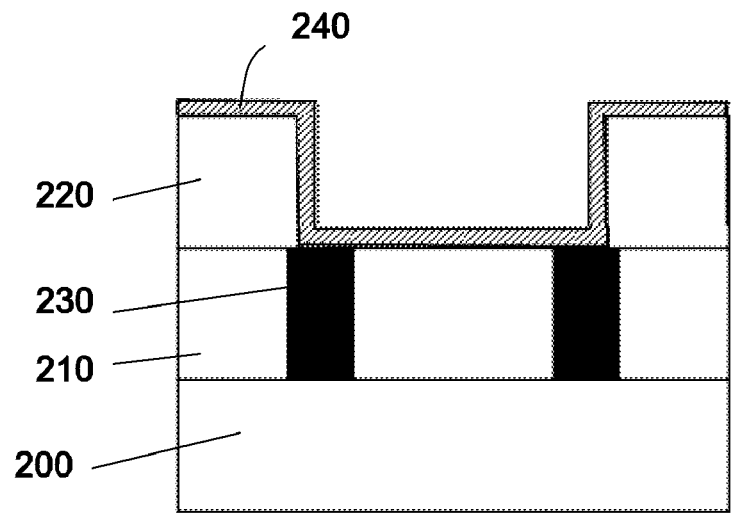
Figure 2B:
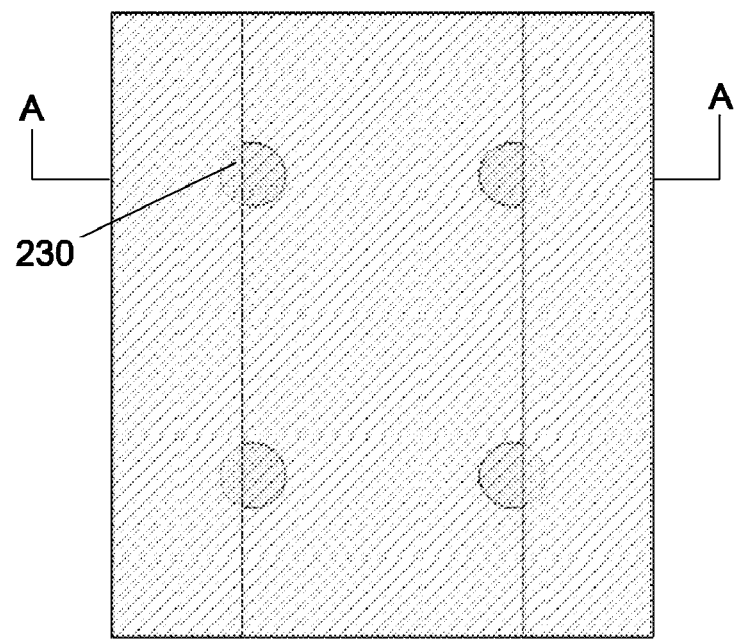
Figure 2C:
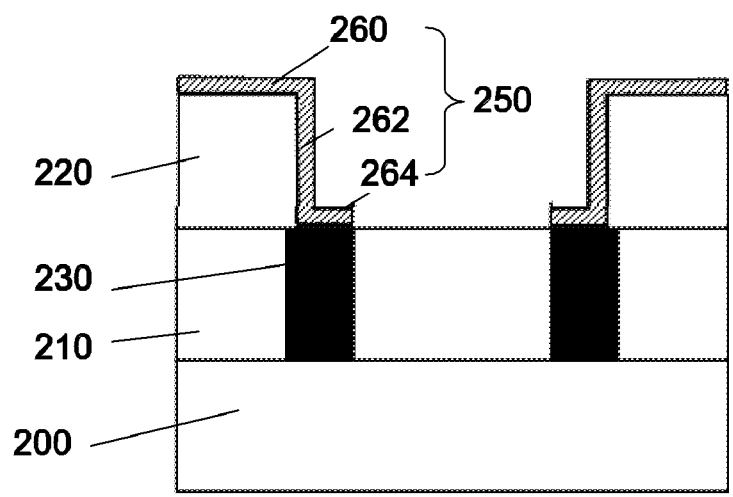
Figure 2D:
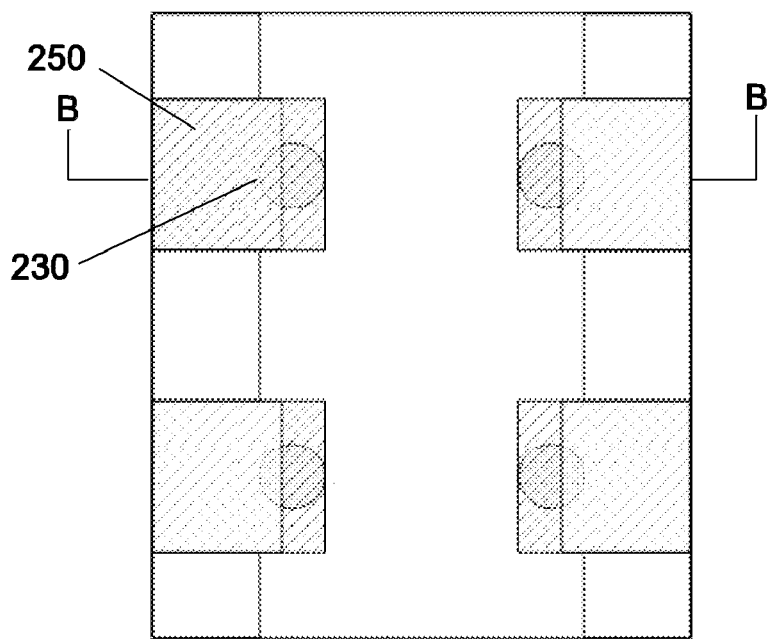
Figure 2E:
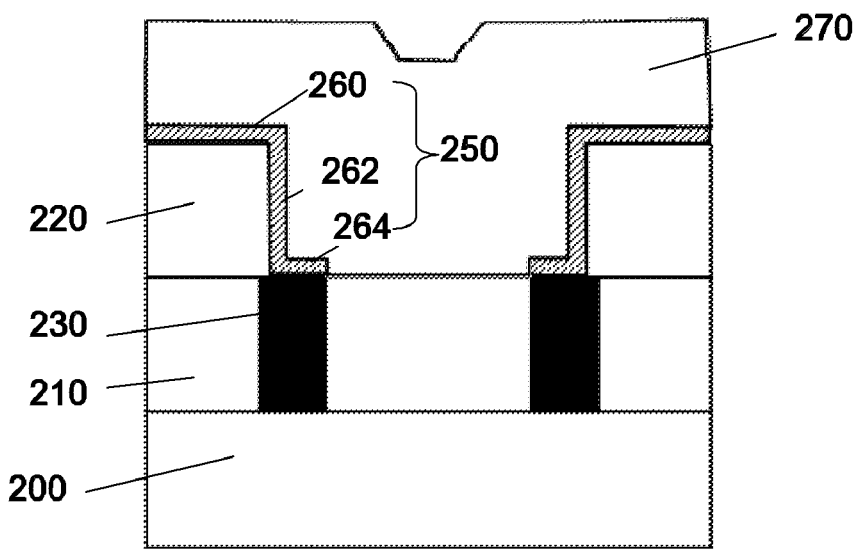
Figure 2F:
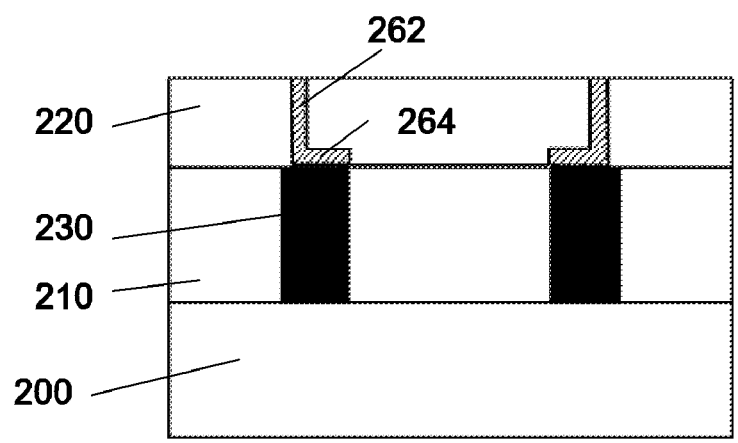

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

At the same time, it should be appreciated that for the convenience of description, the sizes of respective components in these figures may not be drawn based on actual scale.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

It is understood that similar reference numerals and letters refer to similar items in the following figures, and thus once an item is defined in one figure, it is possible that it need not be further discussed for following figures.

Figure 3A:
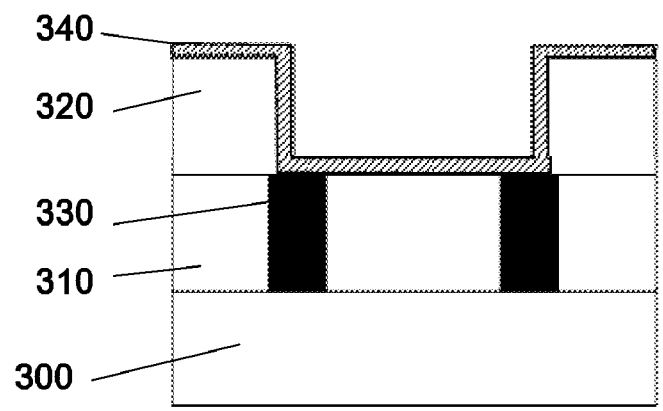
Figure 3B:
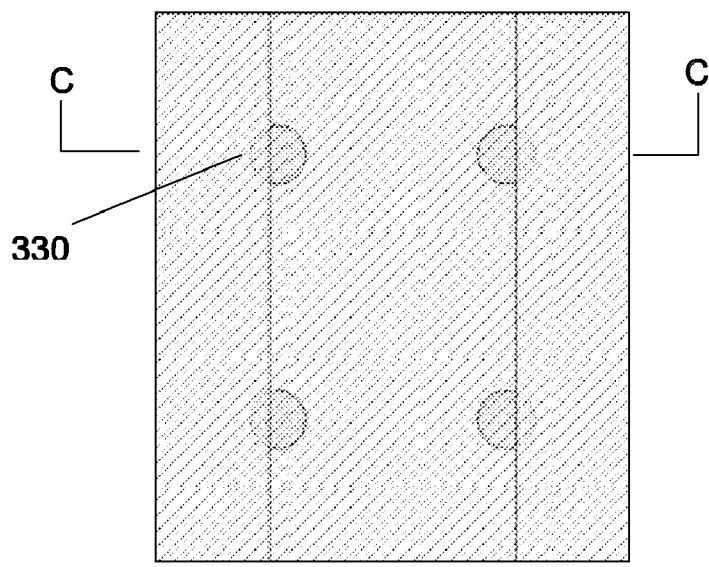

A method of manufacturing a semiconductor device according to embodiments of the present invention will be described with reference to FIGS. 3A to 3I and FIG. 4 below. FIGS. 3A to 3I schematically show various steps of a process flow of manufacturing a semiconductor device according to embodiments of the present invention, wherein FIGS. 3A, 3C, 3E-3I are sectional views, and FIGS. 3B and 3D are top views. FIG. 4 is a flowchart showing a method of manufacturing semiconductor device according to embodiments of the present invention.

At step S410, a step-shaped bottom electrode is formed on a substrate.

Figure 3C:
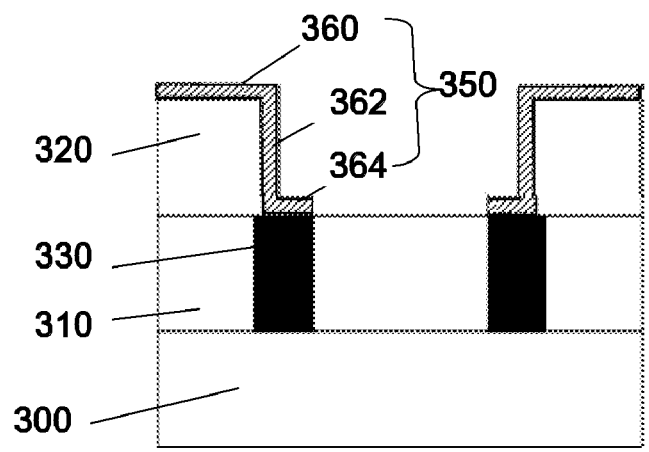
Figure 3D:
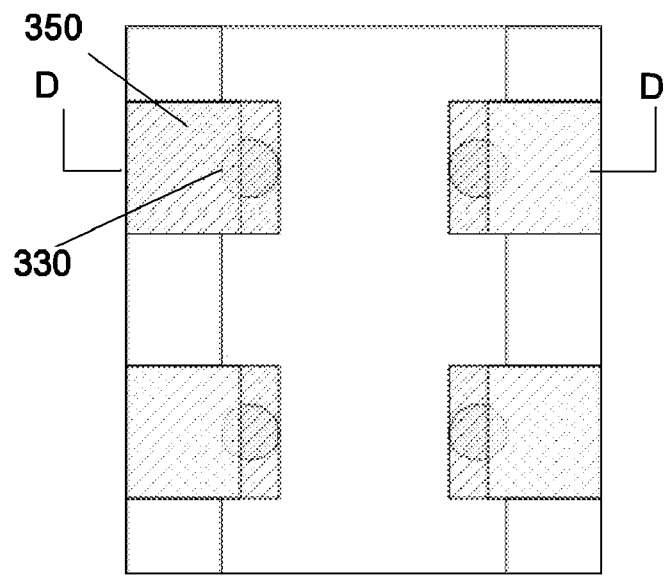
Figure 4:
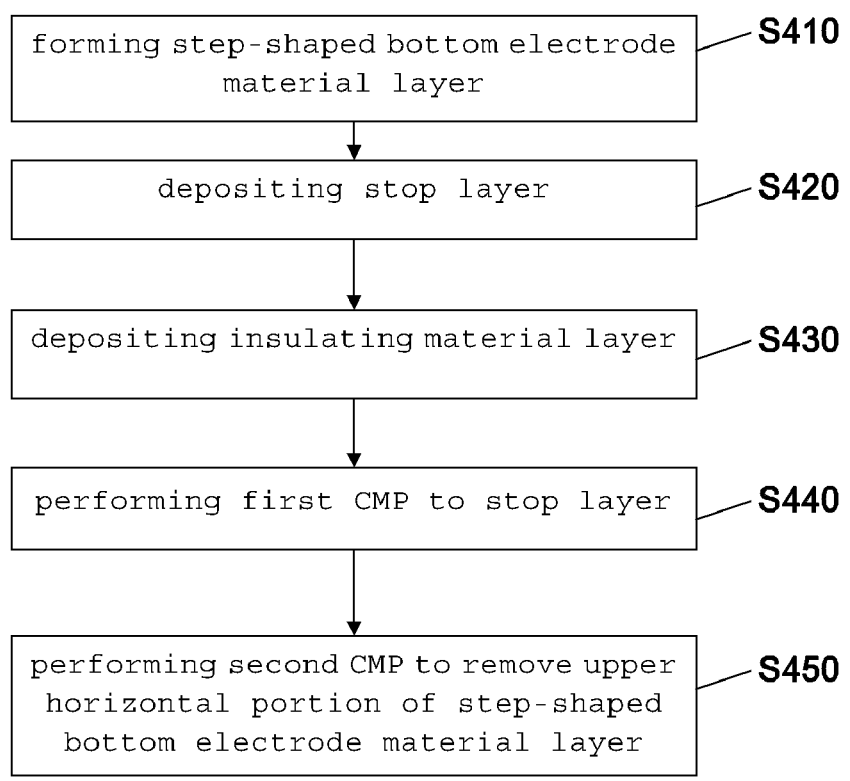
FIG. 4 is a flowchart showing a method of manufacturing a semiconductor device according to embodiments of the present invention.

First, a step-shaped bottom electrode 350 is formed on the substrate as shown in the sectional view of FIG. 3C and the top view of FIG. 3D. The bottom electrode 350 has an upper horizontal portion 360, a vertical portion 362, and a lower horizontal portion 364.

FIG. 3D is a top view of the memory cell after forming the step-shaped bottom electrode 350, and FIG. 3C is a sectional view taken along a line "D-D" in FIG. 3D.

The step-shaped bottom electrode 350 as shown in FIG. 3C can be formed by the following method.

First, a second insulating layer 310 and a third insulating layer 320 are sequentially formed on a substrate 300.

A portion of the third insulating layer 320 is etched off to expose part of the upper surface of the second insulating layer 310.

A bottom electrode 340 is deposited as shown in the sectional view of FIG. 3A and the top view of FIG. 3B, wherein FIG. 3A is a sectional view taken along a line "C-C" of FIG. 3B.

Next, the bottom electrode 340 is etched to form the step-shaped bottom electrode 350 which is patterned as shown in FIGS. 3C and 3D.

Further, a contact plug 330 can be formed in the second insulating layer 310. The lower horizontal portion 364 of the bottom electrode 350 can be in contact with the contact plug 330 in the second insulating layer 310.

At step S420, a stop layer is formed above the bottom electrode.

Figure 3E:
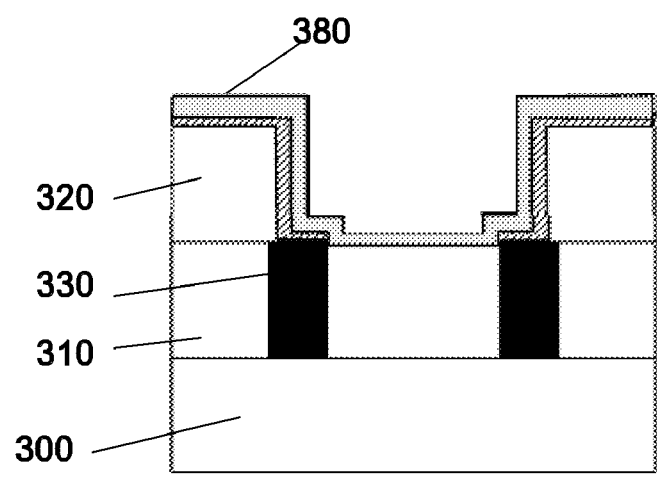

Next, a stop layer 380 is formed to cover the bottom electrode 350 and the exposed part of the upper surface of the second insulating layer 310, as shown in FIG. 3E. In a preferred example, the stop layer 380 can be formed by deposition.

The stop layer 380 is used to divide the chemical mechanical polishing process into two stages. Therefore, it is necessary for the materials of the stop layer 380 and the insulating layer 370 to be deposited thereon to have different selectivity ratios in the chemical mechanical polishing process. The stop layer may comprise at least one of amorphous carbon, $Al_2O_3$, SiCNH, $TiO_2$, $HfO_2$, $Ta_2O_5$ and SiN, and it may have a thickness ranging from 200 Å to 1000 Å. In another embodiment, the stop layer may have a thickness ranging from 200 Å to 500 Å.

At step S430, a first insulating layer is formed above the stop layer.

Figure 3F:
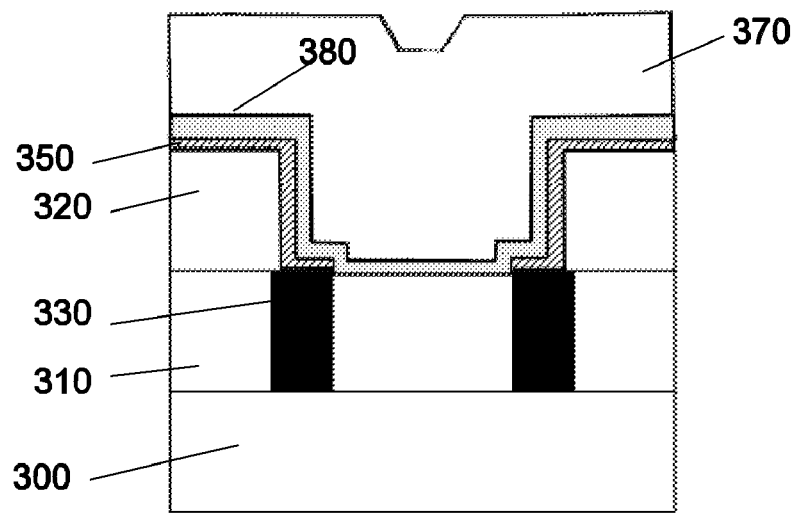

Next, a first insulating layer 370 is formed above the stop layer 380 as shown in FIG. 3F.

The first insulating layer can be deposited through a high aspect ratio process.

The material of the first insulating layer may comprise silicon oxide.

At step S440, a first chemical mechanical polishing process is performed until the stop layer is exposed.

Figure 3G:
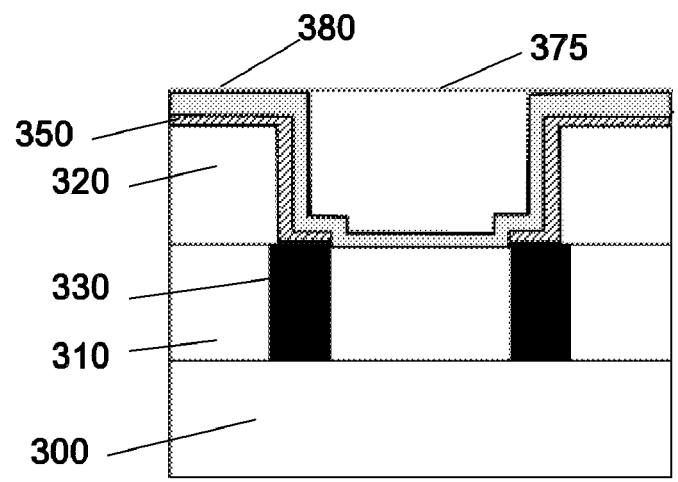

As shown in FIG. 3G, since the stop layer 380 and the first insulating layer 370 have different selectivity ratios in the chemical mechanical polishing process, when the first insulating layer 370 is removed through the first chemical mechanical polishing process, the polish of stop layer 380 will become slower. Therefore, the first chemical mechanical polishing process can be controlled, so that when the polishing rate becomes relatively slow, that is, when the polishing process proceeds to the stop layer, the first chemical mechanical polishing process can be terminated.

At step S450, a second chemical mechanical polishing process is performed to remove the upper horizontal portion of the bottom electrode.

Figure 3H:
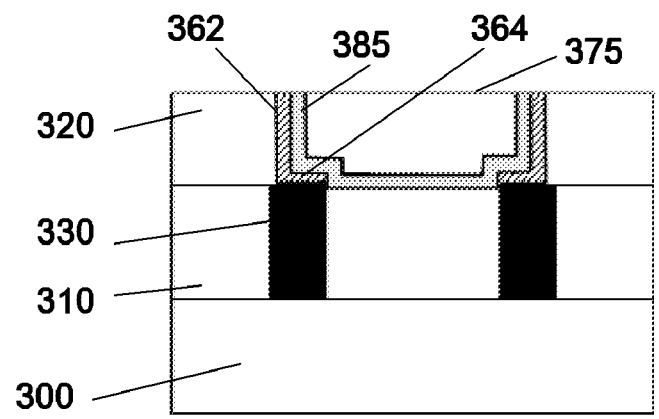

Next, a second chemical mechanical polishing process is further performed to polish the stop layer 380 and the horizontal portion 360 of the bottom electrode 350, until the surface of the third insulating layer 320 is exposed as shown in FIG. 3H.

As a comparison, in situations of the prior art without a stop layer, the insulating layer is planarized and the horizontal portion of the bottom electrode is removed through a single chemical mechanical polishing process. Since the total thickness to be polished is relatively large, it is difficult to precisely control the etching of the bottom electrode by polishing time.

In the present invention, however, through arranging a stop layer, the chemical mechanical polishing process is divided into two stages.

As compared to the first insulating layer 370, the stop layer 380 and the horizontal portion 360 of the bottom electrode 350 are relatively thin.

The first chemical mechanical polishing process for removing the first insulating layer 370 which is relatively thick is terminated in the stop layer 38

The second chemical mechanical polishing process for the stop layer 380 and the horizontal portion 360 of the bottom electrode 350 which are relatively thin shall be controlled precisely. Since the stop layer 380 and the horizontal portion 360 of the bottom electrode 350 are relatively thin, it is easy to control polishing depth by polishing time, so as to prevent the vertical portion 362 of the bottom electrode 350 from being over removed, and reducing the unnecessary loss of the bottom electrode.

Since the polishing process of the bottom electrode can be precisely controlled, the height of the vertical portion 362 of the bottom electrode 350 can also be precisely controlled.

Figure 3I:
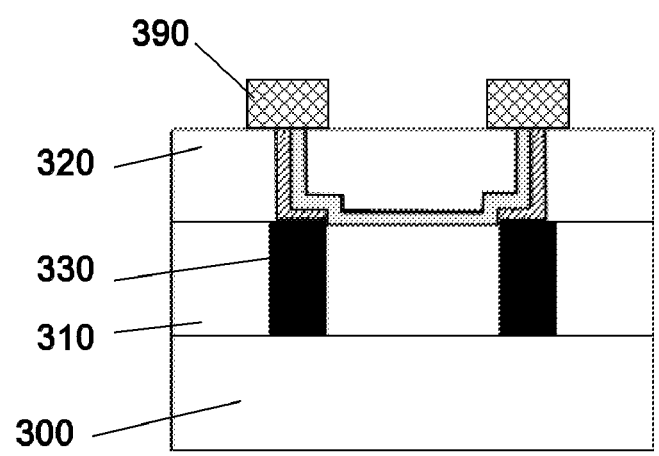

Next, as shown in FIG. 3I, a phase-change material 390 is formed above the exposed portion 362 of the bottom electrode 350. The phase-change material can be chalcogenide, such as $Ge_2Sb_2Te5$ A semiconductor device manufactured according to the method of embodiments of this invention will be described below with reference to FIG. 3H.

An L-shaped bottom electrode and a first insulating layer 375 are formed on a substrate. The L-shaped bottom electrode has a vertical portion 362 and a lower horizontal portion 364.

An L-shaped stop layer 385 is formed between the L-shaped bottom electrode and the first insulating layer 375. The L-shaped stop layer 385 has a vertical portion and a horizontal portion. The vertical portion is sandwiched between the vertical portion 362 of the L-shaped bottom electrode and the first insulation layer 375, and the horizontal portion is sandwiched between the lower horizontal portion 364 of the bottom electrode and the first insulation layer 375.

The L-shaped stop layer 385 and the first insulating layer 375 have different chemical mechanical polishing selectivity ratios. In the semiconductor device manufacturing process above described, a chemical mechanical polishing process is divided into two stages by a stop layer above the upper horizontal portion 360 of the bottom electrode 350 which is deposited simultaneously with the L-shaped stop layer 385, so that the second stage of the chemical mechanical polishing process can be easily controlled so as to avoid the unnecessary loss of the vertical portion 362 of the L-shaped bottom electrode.

The first insulating layer 375 may comprise silicon oxide.

The L-shaped stop layer 385 may include at least one of amorphous carbon, $Al_2O_3$, SiCNH, $TiO_2$, $HfO_2$, $Ta_2O_5$ and SiN.

The L-shaped stop layer 385 may has a thickness ranging from 200 Å to 1000 Å. In another embodiment, the stop layer may have a thickness ranging from 200 Å to 500 Å.

As one method of forming the L-shaped bottom electrode 350, the semiconductor device may further include a second insulating layer 310 and a third insulating layer 320.

The second insulating layer 310 is incompletely covered by the third insulating layer 320, thus, the third insulating layer has a sidewall. The lower horizontal portion 364 of the L-shaped bottom electrode is located on the second insulating layer 310, and the vertical portion 362 of the L-shaped bottom electrode is located on the sidewall of the third insulating layer 320.

Further, the semiconductor device may include a contact plug 330 formed in the second insulating layer 310. The vertical portion 362 of the L-shaped bottom electrode 350 is in contact with the contact plug 330.

In order to form a phase-change element, as shown in FIG. 3I, the semiconductor device may further include a phase-change material 390 overlaying the vertical portion 362 of the L-shaped bottom electrode. The phase-change material 390 can be chalcogenide.

Thus, the semiconductor device and its manufacturing method of the present invention have been described in detail. Some details that are well known in the art are not discussed for the purpose of not obscuring the concept of this invention. With the above description, those skilled in the art can thoroughly understand how to implement the technique solutions disclosed herein.

Although some specific embodiments of the present invention have been demonstrated in detail with examples, it should be understood by a person skilled in the art that the above examples are only intended to be illustrative but not to limit the scope of the present invention. It should be understood by a person skilled in the art that the above embodiments can be modified without departing from the scope and spirit of the present invention. The scope of the appended claims therefore should be accorded the broadest interpretation so as to encompass all such modifications and similar arrangements and procedures.

What is claimed is:

1. A semiconductor device comprising:
   a substrate;
   an L-shaped electrode disposed above the substrate, said electrode having a vertical portion and a lower horizontal portion, said vertical portion having a first vertical side surface, a second vertical side surface opposite said first vertical side surface, and an upper end surface connected to said first vertical side surface and said second vertical side surface at a top of said L-shape, said lower horizontal portion extending from a bottom of the vertical portion, said lower horizontal portion having an top horizontal surface extending horizontally from and connected to said second vertical side surface at a corner portion of said L-shape, a bottom horizontal surface extending horizontally from and connected to said first vertical side surface at said corner portion of said L-shape, and a lower end surface extending vertically from said top horizontal surface to said bottom horizontal surface and connected to said top horizontal surface and said bottom horizontal surface, and wherein a width of the lower horizontal portion between the top horizontal surface and the bottom horizontal surface is constant;
   a first insulating layer; and an L-shaped stop layer disposed between the electrode and the first insulating layer, said L-shaped stop layer having a horizontal portion overlaying and in contact with said top horizontal surface of said lower horizontal portion of said electrode, a side portion overlaying and in contact with said lower end surface of said lower horizontal portion of said electrode, and a vertical portion adjacent to and in contact with said vertical portion of said electrode;
   said L-shaped stop layer and said first insulating layer having different chemical mechanical polishing selectivity ratios.

2. The semiconductor device according to claim 1 wherein said L-shaped stop layer comprises at least one of amorphous carbon, $Al_2O_3$, SiCNH, $TiO_2$, $HfO_2$, $Ta_2O_5$ and SiN.

3. The semiconductor device according to claim 1 wherein said L-shaped stop layer has a thickness ranging from 200 Å to 1000 Å.

4. The semiconductor device according to claim 1 wherein said first insulating layer comprises silicon oxide.

5. The semiconductor device according to claim 1 further comprising: a phase-change material overlaying the vertical portion of said electrode.

6. The semiconductor device according to claim 5 wherein said phase-change material is chalcogenide.

7. The semiconductor device according to claim 1 further comprising:
   a second insulating layer overlaying the substrate; and
   a third insulating layer overlaying the second insulating layer, said third insulating layer having a sidewall, wherein the lower horizontal portion of said electrode is disposed above said second insulating layer, and the vertical portion of said electrode is adjacent the sidewall of said third insulating layer.

8. The semiconductor device according to claim 7 further comprising: a contact plug disposed in said second insulating layer, said contact plug extending from a lower surface of the second insulating layer to a top surface of the second insulating layer, the lower horizontal portion of said electrode being in contact with said contact plug and the side portion of the L-shaped stop layer being in contact with a top surface of the second insulating layer.

* * * * *